United States Patent [19]

Nomura et al.

[11] Patent Number: 5,310,862

[45] Date of Patent: May 10, 1994

[54] PHOTOSENSITIVE POLYIMIDE PRECURSOR COMPOSITIONS AND PROCESS FOR PREPARING SAME

[75] Inventors: Hideshi Nomura, Otsu; Masuichi Eguchi, Kyoto; Masaya Asano, Otsu, all of Japan

[73] Assignee: Toray Industries, Inc., Japan

[21] Appl. No.: 926,766

[22] Filed: Aug. 6, 1992

[30] Foreign Application Priority Data

Aug. 20, 1991 [JP] Japan .................... 3-208312
Oct. 14, 1991 [JP] Japan .................... 3-264836

[51] Int. Cl.$^5$ ................ C08G 69/26; C08G 73/12
[52] U.S. Cl. .................... 528/353; 528/125; 528/126; 528/128; 528/172; 528/173; 528/179; 528/188; 528/192; 528/220; 528/229; 528/350; 528/351; 528/392; 522/63; 522/65; 522/78; 524/600; 430/270
[58] Field of Search .............. 528/353, 351, 350, 352, 528/188, 192, 179, 125, 128, 172, 229, 220, 392; 430/270; 524/600; 522/63, 65, 78

[56] References Cited

U.S. PATENT DOCUMENTS

| | | | |
|---|---|---|---|
| 3,957,512 | 5/1976 | Kleeberg | 528/188 |
| 4,243,743 | 1/1981 | Hiramoto | 430/906 |
| 4,321,319 | 3/1982 | Shoji et al. | 522/65 |
| 4,352,878 | 10/1982 | Miura et al. | 430/196 |
| 4,383,903 | 5/1983 | Ayano et al. | 430/196 |
| 4,451,551 | 5/1984 | Kataoka et al. | 430/197 |
| 4,564,580 | 1/1986 | Ichimura | 430/906 |
| 4,576,897 | 3/1986 | Fujikawa | 430/906 |
| 4,598,038 | 7/1986 | Ahne | 430/906 |
| 4,608,333 | 8/1986 | Ohbayashi | 430/906 |
| 4,629,777 | 12/1986 | Pfeifer | 430/906 |
| 4,654,415 | 3/1987 | Ahne | 528/192 |
| 4,677,186 | 6/1987 | Pfeifer | 528/220 |
| 4,783,391 | 11/1988 | Ohbayashi et al. | 430/196 |
| 5,132,386 | 7/1992 | Suzuki | 528/26 |
| 5,165,957 | 11/1992 | Uchimura et al. | 427/96 |

FOREIGN PATENT DOCUMENTS 62-159449 7/1987 Japan .
63-14452 1/1988 Japan .
63-15744 1/1988 Japan .

Primary Examiner—John Kight, III
Assistant Examiner—P. Hampton-Hightower
Attorney, Agent, or Firm—Austin R. Miller

[57] ABSTRACT

A photosensitive polyimide precursor composition containing as main ingredients a poly(amic acid) wherein at least one molecular end is esterified with an alcohol, a compound containing carbon-carbon unsaturation having photoreactivity, and a photopolymerization initiator.

The photosensitive polyimide precursor composition of the present invention can be prepared without the formation of any harmful by-product. When film formed from this composition is masked for patterning and then subjected to exposure and development using a developer, the amount of exposed portion dissolved in the developer until unexposed portion is dissolved off by the developer, is small and so it is possible to obtain a thick pattern. Further, by heat-treating this pattern, there can be obtained a thick polyimide pattern.

25 Claims, No Drawings

PHOTOSENSITIVE POLYIMIDE PRECURSOR COMPOSITIONS AND PROCESS FOR PREPARING SAME

BACKGROUND OF THE INVENTION

The present invention relates to a novel photosensitive polyimide precursor composition. More particularly, the present invention is concerned with a novel photosensitive polyimide precursor composition which can be used in forming protective films for semiconductor devices and insulating films for multilayer interconnection substrates.

Recently, in the field of electronic industry, polyimides prepared by heat-treating poly(amic acid)s as polyimide precursors have been used as protective films and interlayer insulating films because of their superior heat resistance and dielectric characteristics. In the case of using a poly(amic acid) of a conventional structure, however, a complicated process using a photoresist is required for forming a pattern on a polyimide film obtained from such poly(amic acid). In order to solve this problem there has been proposed the use of a photosensitive polyimide precursor which permits direct formation of a pattern through exposure and development.

As such photosensitive polyimide precursor, in U.S. Pat. No. 3,957,512 there is proposed one wherein a photosensitive group is ester-linked to the carboxyl group in a poly(amic acid) molecule. This photosensitive polyimide precursor is prepared by reacting a tetracarboxylic acid dianhydride with an alcohol containing carbon-carbon unsaturation having photoreactivity to form a tetracarboxylic diester, then converting free carboxyl groups in the diester into acid chloride groups, and polycondensing the resulting diester-bis-acid chloride with a diamine. However, in the photosensitive polyimide precursor obtained by this process there eventually remains a chloride as a by-product because a dehydrochlorination reaction is included in the manufacturing process. For removing this residual by-product chloride which is harmful, it is necessary to conduct a purification treatment which is expensive.

In U.S. Pat. No. 4,654,415 there is disclosed a photosensitive polyimide precursor wherein a photosensitive group is ester-linked to the carboxyl group in a poly(amic acid) molecule, using a process different from the process just referred to above. This photosensitive polyimide precursor is prepared by reacting a tetracarboxylic dianhydride with an alcohol containing carbon-carbon unsaturation having photoreactivity to form a tetracarboxylic diester and then reacting the diester with a diamine in the presence of carbodiimide. Also in this process, however, there remains a urea derivative as a by-product and a purifying treatment for separating the urea derivative is required in preparing a coating solution of the photosensitive polyimide precursor.

In U.S. Pat. No. 4,243,743 there is disclosed a photosensitive polyimide precursor prepared by incorporating in a poly(amic acid) a compound containing carbon-carbon unsaturation having photoreactivity and also containing an amino group or a quaternized salt thereof, allowing a photosensitive group to be salt-linked to the carboxyl group or a salt thereof contained in the poly(amic acid) molecule. This photosensitive polyimide precursor can be prepared without the formation of any harmful by-product. For example, however, in the case of using a polyimide film as a semiconductor protecting film, the larger the film thickness, the greater the α-ray shielding effect. When the surface of film formed from the said photosensitive polyimide precursor is masked for patterning, followed by exposure and development using a developing solution and subsequent heat-treatment to obtain a pattern of the polyimide film, it is very difficult to obtain a polyimide film pattern having a thickness of 10 $\mu$m or more. This is for the following reason. In the photosensitive polyimide precursor, usually a photosensitive group is introduced into the poly(amic acid) which has a high molecular weight and it is introduced by such a relatively weak linkage as salt linkage, so in the case of developing a thick film, the dissolving speed of an unexposed portion into the developing solution is low, and until a complete dissolution of the unexposed portion into the developing solution, the exposed portion is also dissolved in a considerable amount in the developing solution, resulting in that the thickness of the residual exposed portion becomes smaller.

The present invention has been accomplished in view of the above-mentioned drawbacks of the prior art, and it is the object of the invention to provide a photosensitive polyimide precursor composition which can be prepared without the formation of any harmful by-product requiring the application of a purifying treatment and in which, at the time of development after exposure, the amount of an exposed portion dissolved into a developing solution until a complete dissolution of an unexposed portion in the same solution is small, thus affording a pattern of a polyimide film having a large thickness.

SUMMARY OF THE INVENTION

In one aspect of the present invention there is provided a photosensitive polyimide precursor composition containing (a) a poly(amide acid) wherein at least one molecular end is an acid ester of an alcohol, (b) a compound containing carbon-carbon unsaturation having photoreactivity and (c) a photopolymerization initiator.

In another aspect of the present invention there is provided a process for preparing a photosensitive polyimide precursor composition, comprising adding an alcohol to a tetracarboxylic dianhydride to form a tetracarboxylic monoester monoanhydride, then reacting the tetracarboxylic monoester monoanhydride or a mixture of the tetracarboxylic monoester monoanhydride and a tetracarboxylic dianhydride with a diamine to form a poly(amic acid) wherein at least one molecular end is an acid ester of the alcohol, and thereafter mixing a compound containing carbon-carbon unsaturation having a photoreactivity and a photopolymerization initiator with the poly(amic acid).

DESCRIPTION OF PREFERRED EMBODIMENTS

The poly(amic acid) wherein at least one molecular end is an acid ester of alcohol, as referred to herein, is represented by the following general formula (1):

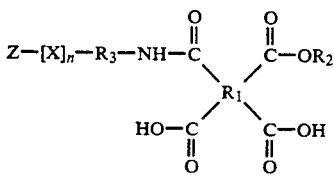

wherein X is represented by the general formula (2)

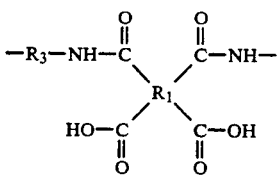

Z is represented usually by the general formula (3)

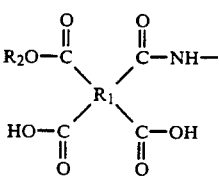

or the general formula (4)

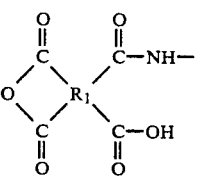

or $NH_2$, provided these are not restrictive and Z may be of another structure; $R_1$ is a tetravalent organic group having 2 to 22 carbon atoms; $R_2$ is a monovalent organic group of 1 to 15 carbon atoms not containing unsaturated bond, or a monovalent organic group of 3 to 15 carbon atoms containing carbon-carbon unsaturation having photoreactivity; $R_3$ is a divalent organic group having 1 to 22 carbon atoms; and n is an integer of 0 or larger. It is desirable that $R_2$ be a monovalent organic group of 3 to 15 carbon atoms containing carbon-carbon unsaturation having photoreactivity, because there will be obtained a better photosensitive characteristic. As to the solubility of an unexposed portion of the poly(amic acid) wherein at least one molecular end is an acid ester of alcohol, the smaller the molecular weight, the higher the solubility. Conversely, if the molecular weight is too small, the amount of an exposed portion dissolved in the developing solution becomes larger, and when the amount of the exposed portion dissolved therein is to be decreased, it is in many cases required to increase the exposure dose to a greater extent. Therefore, it is desired that n be 0 to 99, more preferably 2 to 69, still more preferably 4 to 49, and yet more preferably 6 to 29. So examples of the poly(amic acid) as referred to herein include oligomers such as dimer and trimer. Actually, since there are variations in the degree of polymerization of the poly(amic acid) wherein at least one molecular end is an acid ester of alcohol, a preferred range of n means that 50 mole % or more, more preferably 70 mole % or more, and still more preferably 90 mole % or more, of the entire poly(amic acid) is included therein.

The poly(amic acid) wherein at least one molecular end is an acid ester of alcohol used in the present invention can be obtained, for example, by adding a diamine to a tetracarboxylic monoester monoanhydride which is prepared by adding an alcohol to a tetracarboxylic dianhydride, or to a mixture of the said tetracarboxylic monoester monoanhydride and a tetracarboxylic dianhydride.

The tetracarboxylic dianhydride is represented by the general formula (5)

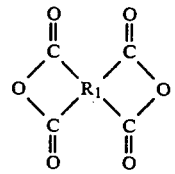

wherein $R_1$ is a tetravalent organic group having 2 to 22 carbon atoms as referred to above. For example, aliphatic or alicyclic tetracarboxylic dianhydrides are employable. Concrete examples are butanetetracarboxylic dianhydride, pentanetetracarboxylic dianhydride, hexanetetracarboxylic dianhydride, cyclobutanetetracarboxylic dianhydride, cyclopentanetetracarboxylic dianhydride, bicyclohexenetetracarboxylic dianhydride, cyclopropanetetracarboxylic dianhydride, and methylcyclohexenetetracarboxylic dianhydride. The use of an aromatic tetracarboxylic dianhydride can afford a photosensitive polyimide precursor composition capable of being converted to a polyimide superior in heat resistance. Examples are 3,3',4,4'-benzophenonetetracarboxylic dianhydride, pyromellitic dianhydride, 3,4,9,10-perylenetetracarboxylic dianhydride, 4,4'-sulfonyldiphthalic dianhydride, 3,3',4,4'-biphenyltetracarboxylic dianhydride, 1,2,5,6-naphthalenetetracarboxylic dianhydride, 2,3,6,7-naphthalenetetracarboxylic dianhydride, 1,4,5,8-naphthalenetetracarboxylic dianhydride, and 2,3,5,6-pyridinetetracarboxylic dianhydride. These are not restrictive. In the present invention, one or more of tetracarboxylic dianhydrides, including those just exemplified above, are used.

The alcohol used in the present invention is represented by the general formula (6)

$R_2$—OH (6)

wherein $R_2$ is a monovalent organic group of 1 to 15 carbon atoms not containing unsaturated bond, or a monovalent organic group of 3 to 15 carbon atoms containing unsaturated bond, as referred to previously, provided phenyl is not directly attached to the hydroxyl group. As examples of the alcohol not containing unsaturated bond there are mentioned monohydric aliphatic alcohols such as methyl alcohol, ethyl alcohol, isopropyl alcohol and isobutyl alcohol; polyhydric alcohols such as ethylene glycol, propylene glycol, glycerin and trimethylolpropane; and cellosolves such as methyl cellosolve, ethyl cellosolve and butyl cellosolve. But no special limitation is placed thereon.

As examples of the alcohol containing unsaturated bond there are mentioned aliphatic alcohols having carbon-carbon double bond such as allyl alcohol and 2-allyloxyethanol. But the use of a (meth)acrylic acid ester wherein the ester has an alcoholic hydroxyl group can afford a photosensitive polyimide precursor superior in photosensitivity. Examples are 2-hydroxyethyl acrylate, 2-hydroxypropyl acrylate, glycerol acrylate, polyethylene glycol acrylate, EO-modified phthalic acid acrylate, and compounds resulting from replacement of these acrylates with methacrylates. But no special limitation is placed thereon. In the present invention, one or more of alcohols containing an unsaturated bond, including those just exemplified above, are used.

The diamine used in the present invention is represented by the general formula (7)

$$H_2N-R_3-NH_2 \quad (7)$$

wherein $R_3$ is a divalent organic group having 1 to 22 carbon atoms, as referred to previously. Examples are 4,4'-diaminodiphenyl ether, 4,4'-diaminodiphenylmethane, 4,4'-diaminodiphenylsulfone, 4,4'-diaminodiphenyl sulfide, m-phenylenediamine, p-phenylenediamine, 2,4-diaminotoluene, 2,5-diaminotoluene, 2,6-diaminotoluene, benzidine, 3,3'-dimethylbenzidine, 3,3'-dimethoxybenzidine, o-tolidine, 4,4''-diaminoterphenyl, 1,5-diaminonaphthalene, 2,5-diaminopyridine, 3,3'-dimethyl-4,4'-diaminodiphenylmethane, 4,4'-bis(p-aminophenoxy)biphenyl, 2,2-bix[4-(p-aminophenoxy) phenyl]propane, and hexahydro-4,7-methanoindanylene dimethylene diamine. But no special limitation is placed thereon. The use of a siloxanediamine represented by the following general formula (8) can improve the adhesion to an organic substrate:

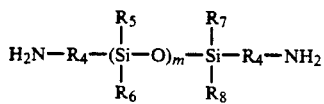

wherein $R_4$ is a divalent organic group having 1 to 10 carbon atoms, $R_5$, $R_6$, $R_7$ and $R_8$, which may be the same or different, are each a monovalent organic group having 1 to 10 carbon atoms, and m is an integer of 1 to 10. The siloxane diamine is used usually in an amount of 1 to 20 mole % of the whole diamine. If the amount of the siloxanediamine used is too small, there will not be attained an improvement of adhesion, and if it is too large, the heat resistance will be deteriorated. As an example of the siloxanediamine there is mentioned bis-3-(aminopropyl)tetramethylsiloxane. One or more of such diamines are used in the present invention.

The poly(amic acid) wherein at least one molecular end is an acid ester of alcohol, used in the present invention, is prepared in the following manner for example. First, a reaction of adding an alcohol to a tetracarboxylic dianhydride to obtain a tetracarboxylic monoester monoanhydride is carried out in an inert organic solvent at a temperature in the range of 20° to 150° C., preferably 50° to 100° C. If the temperature is too low, the reaction will not proceed smoothly, and for setting the temperature high, a great deal of energy is required, which is expensive. In the case where an unsaturated alcohol is added to the tetracarboxylic dianhydride, or the addition of alcohol to the tetracarboxylic dianhydride is performed in an organic solvent containing carbon-carbon unsaturation having photoreactivity, e.g. acrylamide, the reaction is conducted at a temperature in the range of 20° to 100° C., preferably 50° to 80° C. Higher temperatures may cause cleavage of the carbon-carbon unsaturation.

Usually, the alcohol is reacted with the tetracarboxylic dianhydride substantially in a proportion of 0.010 to 1, preferably 0.014 to 0.333, more preferably 0.020 to 0.200, still more preferably 0.033 to 0.143, mole equivalent. If the amount of the alcohol reacted is too large, the molecular weight of the resulting end-esterified poly(amic acid) will become too small and the amount of an exposed portion dissolved in a developing solution will increase. An attempt to decrease the amount of the exposed portion dissolved requires a larger exposure dose in many cases. On the other hand, if the amount of the alcohol reacted is too small, the molecular weight of the resulting end-esterified poly(amic acid) will become too large, resulting in that the solubility of an unexposed portion in the developing solution is deteriorated. According to the above process there usually are obtained tetracarboxylic diester and unreacted tetracarboxylic dianhydride in addition to the tetracarboxylic monoester monoanhydride. The tetracarboxylic dianhydride is employable effectively in the subsequent reaction with diamine. On the other hand, the tetracarboxylic diester is substantially not necessary in the subsequent reaction, so it is desirable that the proportion thereof be smaller than 0.5, more preferably smaller than 0.1, still more preferably smaller than 0.056, yet more preferably smaller than 0.038, mole equivalent based on the amount of the tetracarboxylic monoester monoanhydride.

Next, a diamine is added into the organic solvent containing the above tetracarboxylic monoester monoanhydride, tetracarboxylic dianhydride and tetracarboxylic diester, allowing the diamine to be added to the tetracarboxylic monoester monoanhydride and tetracarboxylic dianhydride, to afford a poly(amic acid) wherein at least one molecular end is an acid ester of the alcohol. In this case, the diamine is used usually in a proportion of 0.9 to 1.1, preferably 0.95 to 1.05, more preferably 0.99 to 1.01, mole equivalent, still more preferably equimolar equivalent, based on the total mole equivalent of the tetracarboxylic monoester monoanhydride, tetracarboxylic dianhydride and tetracarboxylic diester. The smaller the difference in mole equivalent in the above, the smaller the difference in mole equivalent between amine end and ester end in a polyimide precursor composition obtained by a polymerization reaction which takes place after the mixing and comprising end-esterified poly(amic acid), amine-ended poly(amic acid) and unreacted tetracarboxylic diester. The smaller the difference in mole equivalent between amine end and ester end in the polyimide precursor composition, the higher the degree of polymerization of polymide obtained by heat-treating the polyimide precursor, and hence there can be obtained a film superior in mechanical characteristics. Therefore, it is desired to equalize the amine end-ester end mole equivalent. The reaction with diamine is carried out usually at a temperature in the range of 0° to 100° C., preferably 50° to 80° C. If the temperature is too low, the reaction will not proceed smoothly, and a too high temperature may cause the imidization of poly(amic acid).

Diamine and additional tetracarboxylic dianhydride may be incorporated into the organic solvent containing the tetracarboxylic monoester monoanhydride, tetracarboxylic dianhydride and tetracarboxylic diester, allowing a polymerization reaction to take place. In this case, it is desired that the mixing ratio of the tetracarboxylic monoester monoanhydride, tetracarboxylic dianhydride, tetracarboxylic diester and diamine be adjusted so as to afford an end-esterified poly(amic acid) having a desirable polymerization degree and minimize the difference in mole equivalent between amine end and ester end in the resulting polyimide precursor composition comprising the end-esterified poly(amic acid), amine-ended poly(amic acid) and unreacted tetracarboxylic diester.

The organic solvent used in the above process is preferably capable of dissolving the poly(amic acid) wherein at least one of the molecular ends formed is an acid ester of alcohol. Usually, there is used a polar solvent such as, for example, N-methyl-2-pyrrolidone, N,N-dimethylacetamide, N,N-dimethylformamide, dimethyl sulfoxide, tetramethylurea, hexamethylphosphoric triamide, or γ-butyrolactone. Other organic solvents used commonly, such as ketones, esters, hydrocarbons and halogenated hydrocarbons are also employable. Examples are acetone, methyl ethyl ketone, methyl isobutyl ketone, cyclohexanone, methyl acetate, ethyl acetate, butyl acetate, diethyl oxalate, diethyl malonate, diethyl ether, ethylene glycol dimethyl ether, tetrahydrofuran, dichloromethane, 1,2-dichloroethane, 1,4-dichlorobutane, trichloroethane, chlorobenzene, o-dichlorobenzene, hexane, heptane, octane, benzene, toluene, and xylene. Further employable are amide compounds containing carbon-carbon unsaturation having photoreactivity, such as, for example, N-methylacrylamide, N-methylmethacrylamide, N-ethylmethacrylamide, N,N-dimethylacrylamide, N,N-diethylacrylamide, N-acryloylmorpholine, and N-vinylpyrrolidone. For complete dissolution of the poly(amic acid) wherein at least one molecular end is an acid ester of alcohol, it is desirable that these commonly-used organic solvents and amide compounds containing carbon-carbon unsaturation having photoreactivity be used in a mixed state with the foregoing polar solvents.

As to the compound containing carbon-carbon unsaturation having photoreactivity used in the present invention, there is no special limitation. But the incorporation of an amino group therein is desirable because it will be salt-linked to the carboxyl group in the poly(amic acid) molecule and the amount of an exposed portion of the resulting photosensitive polyimide precursor composition dissolved in a developing solution becomes smaller than that in the use of a photoreactive compound not containing an amino group.

Examples of compounds containing both carbon-carbon unsaturation having photoreactivity and amino group are those represented by the general formula (9)

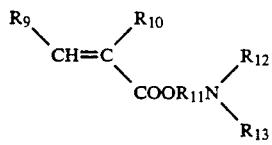

wherein $R_9$ is hydrogen or phenyl, $R_{10}$ is hydrogen or a lower alkyl group having 1 to 6 carbon atoms, $R_{11}$ is a substituted or unsubstituted hydrocarbon group having 1 to 12 carbon atoms, $R_{12}$ and $R_{13}$ are each a substituted or unsubstituted alkyl group having 1 to 6 carbon atoms; those represented by the general formula (10)

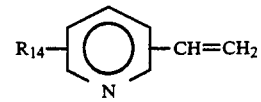

wherein $R_{14}$ is a substituted or unsubstituted alkyl group having 1 to 6 carbon atoms; and those represented by the general formula (11)

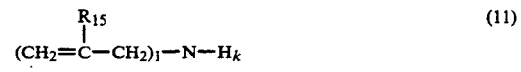

wherein $R_{15}$ is hydrogen or methyl, $k+l=3$ and $k=1\sim3$. More concrete examples include N,N-dimethylaminoethyl acrylate, N,N-diethylaminoethyl acrylate, N,N-dimethylaminopropyl acrylate, N,N-diethylaminopropyl acrylate, N,N-dimethylaminobutyl acrylate, N,N-diethylaminobutyl acrylate, and compounds resulting from replacement of these acrylates with methacrylates, as well as 2-vinylpyridine, 4-vinylpyridine, allylamine, 2-methylallylamine, and diallylamine. But these are not restrictive. From the standpoint of photoreactivity, however, amino compounds having acryl or methacryl group as an unsaturated group are desirable.

It is desirable that the compound containing both carbon-carbon unsaturation having photoreactivity and amino group be mixed with the poly(amic acid) in a proportion of 0.05 to 2, more preferably 0.1 to 1, mole equivalent relative to the carboxyl group in the poly(amic acid) molecule. If its proportion is too low, photosensitivity will be deteriorated, and if it is too high, the decrease of film thickness will be to an excess degree at the time of forming a polyimide film by heat-treating the polyimide precursor film.

In the present invention, a compound containing carbon-carbon unsaturation having photoreactivity but not containing amino group is employable, and it may be used together with the compound containing both carbon-carbon unsaturation having photoreactivity and amino group. As examples of the compound containing carbon-carbon unsaturation having photoreactivity and not containing amino group there are mentioned allyl acrylate, benzyl acrylate, butoxyethyl acrylate, butoxytriethylene glycol acrylate, cyclohexyl acrylate, dicyclopentanyl acrylate, dicyclopentenyl acrylate, 2-ethylhexyl acrylate, glycerol acrylate, glycidyl acrylate, heptadecafluorodecyl acrylate, 2-hydroxyethyl acrylate, isoboronyl acrylate, 2-hydroxypropyl acrylate, isodecyl acrylate, isooctyl acrylate, lauryl acrylate, 2-methoxyethyl acrylate, methoxyethylene glycol acrylate, methoxydiethylene acrylate, methoxytriethylene glycol acrylate, methoxydipropylene glycol acrylate, octafluoropentyl acrylate, phenoxyethyl acrylate, stearyl acrylate, trifluoroethyl acrylate, allylated cyclohexyl diacrylate, bisphenol A diacrylate, 1,4-butanediol acrylate, 1,3-butylene glycol diacrylate, ethylene glycol diacrylate, diethylene glycol diacrylate, triethylene glycol diacrylate, polyethylene glycol diacrylate, dipentaerythritol hexaacrylate, dipentaerythritol monohydroxy pentaacrylate, ditrimethylolpropane tetraacrylate, glycerol diacrylate, methoxylated cyclohexyl diacrylate, neopentyl glycol diacrylate, pentaerythritol triacrylate, pentaerythritol tetraacrylate, propylene glycol diacrylate, polypropylene glycol diacrylate, triglycerol diacrylate, trimethylolpropane triacrylate, and compounds resulting from replacement of these acrylates with methacrylates, as well as γ-methacryloxypropyl trimethoxy silane. But there is made no special limitation to these compounds. The foregoing amide compound containing carbon-carbon unsaturation having photoreactivity such as N-methylacrylamide, N-methylmethacrylamide, N-ethylmethacrylamide, N,N-dimethylacrylamide, N,N-diethylacrylamide, N-acryloylmorpholine, or N-vinylpyrrolidone, may also be used as the compound containing carbon-carbon unsaturation having photoreactivity and not containing amino group. One or more of these compounds may be used in the present invention.

In the case where the compound containing carbon-carbon unsaturation having photoreactivity and not containing amino group is used in combination with the compound containing both carbon-carbon unsaturation having photoreactivity and amino group, it is desirable that the amount of the former compound used be in the range of 1 to 100%, more preferable 5 to 50%, still more preferably 10 to 25%, by weight based on the weight of the poly(amic acid). When the former compound is not used together with the compound containing both carbon-carbon unsaturation having photoreactivity and amino group, it is desirable to use it in an amount of 5 to 200%, more preferably 10 to 100%, still more preferably 20 to 50%, by weight based on the weight of the poly(amic acid). If the amount of the former compound, i.e., a compound containing carbon-carbon unsaturation and not containing amino group, is too large, there will occur phase separation between it and the poly(amic acid) at the time of forming a polyimide precursor film, or the decrease of film thickness will be to an excess degree at the time of forming a polyimide film by heat-treating the polyimide precursor film. And if the amount of the said compound is too small, the photosensitivity of the photosensitive composition obtained will be poor.

The photopolymerization initiator used in the present invention is a known compound. Examples are benzophenone, methyl o-benzoylbenzoate, 4,4'-bis(dimethylamino)benzophenone, 4,4'-bis(diethylamino) benzophenone, 4,4'-dichlorobenzophenone, 4-benzoyl-4'-methyldiphenyl ketone, dibenzyl ketone, fluorenone, 2,2'-diethoxyacetophenone, 2,2-dimethoxy-2-phenylacetophenone, 2-hydroxy-2-methylpropiophenone, p-t-butyldichloroacetophenone, thioxanthone, 2-methylthioxanthone, 2-chlorothioxanthone, 2-isopropylthioxanthone, diethylthioxanthone, benzyl, benzyl dimethyl ketal, benzyl-β-methoxyethyl acetal, benzoin, benzoin methyl ether, benzoin butyl ether, anthraquinone, 2-t-butylanthraquinone, 2-amylanthraquinone, β-chloroanthraquinone, anthrone, benzanthrone, dibenzosuberone, methyleneanthrone, 4-azidobenzalacetophenone, 2,6-bis(p-azidobenzylidine) cyclohexanone, 2,6-bis(p-azidobenzylidene)-4-methylcyclohexanone, 1-phenyl-1,2-butanedione-2-(o-methoxycarbonyl)oxime, 1-phenyl-propanedione-2-(o-ethoxycarbonyl)oxime, 1-phenyl-propanedione-2-(o-benzoyl) oxime, 1,3-diphenyl-propanetrione-2-(o-ethoxycarbonyl)oxime, 1-phenyl-3-ethoxy-propanetrione-2-(o-benzoyl)oxime, Michler's ketone, N-phenylglycine, 3-phenyl-5-isoxazolone, 1-hydroxycyclohexyl phenyl ketone, 2-methyl-[4-(methylthio) phenyl]-2-morpholino-1-propanone, naphthalenesulfonyl chloride, quinolinesulfonyl chloride, N-phenylthioacridone, 4,4'-azobisisobutyronitrile, diphenyl disulfide, benzthiazole disulfide, triphenylphosphine, camphorquinone, carbon tetrabromide, tribromophenylsulfone, benzoyl peroxide, as well as combinations of photo-reducing dyes such as Eosine and methylene blue with reducing agents such as ascorbic acid and triethanolamine. But there is made no special limitation thereto. One or more of these compounds may be used in the present invention.

The amount of the photopolymerization initiator contained in the photosensitive polyimide precursor composition of the present invention is preferably 0.1 to 30 wt %, more preferably 2 to 15 wt %, based on the weight of, the poly(amic acid). If the amount of the photopolymerization initiator is too small, the photosensitivity of the composition will be unsatisfactory, and if it is too large, the decrease of film thickness will be to an excess degree at the time of forming a polyimide film by heat-treating the polyimide precursor film.

A sensitizer for improving the photosensitivity may be incorporated in the photosensitive polyimide precursor composition of the present invention. As examples of such sensitizer there are mentioned 2,5-bis(4'-diethylaminobenzal)cyclopentanone, 2,6-bis(4'-dimethylaminobenzal)cyclohexanone, 2,6-bis(4'-dimethylaminobenzal)-4-methylcyclohexanone, 2,6-bis(4'-diethylaminobenzal)-4-methylcyclohexanone, Michler's ketone, 4,4'-bis(diethylamino)-benzophenone, 4,4'-bis(dimethylamino)chalcone, 4,4'-bis(diethylamino)chalcone, p-dimethylaminocinnamylideneindanone, p-dimethylaminobenzylideneindanone, 2-(p-dimethylaminophenylvinylene)benzothiazole, 2-(p-dimethylaminophenylvinylene)isonaphthothiazole, 1,3-bis(4'-dimethylaminobenzal)acetone, 1,3-bis(4'-diethylaminobenzal)acetone, 3,3'-carbonyl-bis(7-diethylaminocoumarin), N-phenyl-N'-ethylethanolamine, N-phenyldiethanolamine, N-tolyldiethanolamine, N-phenylethanolamine, dimethylaminobenzoic acid isoamyl, 3-phenyl-5-isoxazolone, 1-phenyl-5-benzoylthiotetrazole, and 1-phenyl-5-ethoxycarbonylthio-tetrazole. But these are not restrictive. One or more of these sensitizers may be used in the present invention. Among the sensitizers exemplified above there are included those which function also as photopolymerization initiators.

In the case where a sensitizer(s) is to be incorporated in the photosensitive polyimide precursor composition of the present invention, the amount thereof is preferably 0.1 to 30 wt %, more preferably 0.5 to 15 wt %, based on the weight of the poly(amic acid). If its amount is too large, the film thickness will be decreased to an excess degree at the time of forming a polyimide film by heat-treating the polyimide precursor film, and if the amount thereof is too small, the effect of improving the photosensitivity will not be exhibited.

For improving the thermal stability during preservation of the photosensitive polyimide precursor composition of the present invention, there may be added a thermal polymerization inhibitor. Examples are hydroquinone, N-nitrosodiphenylamine, phenothiazine, p-t-butylcatechol, N-phenylnaphthylamine, 2,6-di-t-butyl-p-methylphenol, chloranil, and pyrogallol. But these are not restrictive. In the case where a thermal polymerization inhibitor is used, the amount thereof is preferably 0.1 to 20 wt %, more preferably 0.5 to 10 wt %, based on the weight of the poly(amic acid). If its amount is too large, the film thickness will be decreased to an excess degree at the time of forming a polyimide film by heat-treating the polyimide precursor film, and if the amount thereof is too small, the effect of improving the thermal stability during preservation will not be exhibited.

For improving the hardness of the polyimide film formed, inorganic fine particles in colloidal form may be incorporated in the photosensitive polyimide precursor composition of the present invention. As examples there are mentioned silica sol, titania sol and zirconia sol, but no limitation is made thereto. In the case where such inorganic fine particles in colloidal form are used, the amount thereof is preferably 1 to 50 wt %, more preferably 2 to 30 wt %, based on the weight of the poly(amic acid). If the amount thereof is too large, the pattern processing property of the polyimide precursor film will be deteriorated, and if it is too small, the effect of improving the hardness of the polyimide film will not be exhibited.

By dissolving the photosensitive polyimide precursor composition of the present invention in an organic solvent capable of dissolving all the ingredients constituting the composition, or in the case of incorporating additives in the composition, capable of dissolving all the ingredients including additives other than those basically insoluble in organic solvents such as inorganic fine particles in colloidal form, there can be obtained a coating varnish. As such organic solvent there may be used the same organic solvent as the organic solvent which is suitably used in preparing the poly(amic acid) with at least one molecular end being an acid ester of alcohol and which can dissolve the said poly(amic acid).

For applying the said varnish onto a substrate there may be adopted a method using spin coater, bar coater, blade coater, or screen printing technique, a method of dipping the substrate into the varnish, or a method of spraying the varnish onto the substrate. As the material of the substrate there may be used a semiconductor such as silicon or gallium-arsenic, an inorganic insulator such as alumina ceramic or glass ceramic, a metal such as aluminum or steel, or an organic insulator such as a polyester film. In the case of applying the varnish onto the substrate formed of a semiconductor, an inorganic insulator or a metal for example, the substrate surface may be treated with a bonding assistant such as silane coupling agent, aluminum chelating agent or titanium chelating agent, whereby the adhesion between the polyimide and the substrate can be improved.

After the varnish comprising the composition of the present invention is applied onto the substrate, a photosensitive polyimide precursor film is formed by air drying, heat drying, or vacuum drying. The film thus obtained is exposed to light using a conventional photo mask. As an actinic radiation to be used in the exposure there may be adopted ultraviolet ray, electron ray, or X-ray, with ultraviolet ray being preferred. As examples of a light source for the actinic radiation there are mentioned low pressure mercury vapor lamp, high pressure mercury vapor lamp, ultra-high pressure mercury vapor lamp, halogen lamp and sterilizing lamp, with ultra-high pressure mercury vapor lamp being particularly suitable. It is preferable that the exposure be conducted in a nitrogen atmosphere or in vacuum.

After the exposure, development is performed using a developing solution. In this case, there may be adopted a dipping method or a spray method. As the developing solution there usually is employed the same organic solvent as the organic solvent which is suitably used in the preparation of the poly(amic acid) with at least one molecular end being an acid ester of alcohol and which can dissolve the said poly(amic acid). For improving the developability, water may be added to the organic solvent. In the case of adding water, the amount thereof is usually 1 to 100 wt %, preferably 5 to 50 wt %, based on the weight of the organic solvent. If the amount of water added is too large, there may occur phase separation between it and the organic solvent, and if the amount thereof is too small, the effect of improving the developability will not be exhibited. Just after the development it is desirable to perform rinsing using an organic solvent such as, for example, ethyl alcohol, isopropyl alcohol, isobutyl alcohol, hexane, or pentane.

The pattern of the polyimide precursor obtained by the development is then converted into a pattern of polyimide by heat treatment. The heat treatment is usually conducted continuously or stepwise in a nitrogen atmosphere or in vacuum, at a temperature of 150° to 450° C., for 0.5 to 5 hours. At this stage, the poly(amic acid) which is relatively low in molecular weight is converted to polyimide of a high molecular weight.

The following examples illustrate the present invention concretely, but it is to be understood that the invention is not limited thereto.

EXAMPLE 1

147.11 g (0.5 mole) of 3,3',4,4'-biphenyltetracarboxylic dianhydride, 65.07 g (0.5 mole) of 2-hydroxyethyl methacrylate and 300 g of N-methyl-2-pyrrolidone were charged into a four-necked 1,000 ml flask equipped with a thermometer, a dry air inlet and a stirrer, and stirring was made at 70° C. for 4 hours while dry air was introduced, followed by cooling to room temperature. Then, 75.09 g (0.375 mole) of 4,4'-diaminodiphenyl ether, 10.81 g (0.1 mole) of p-phenylenediamine, 6.21 g (0.025 mole) of bis-3-(aminopropyl)tetramethylsiloxane and 193.11 g of N-methyl-2-pyrrolidone were added and stirring was made at 60° C. for 3 hours while dry air was introduced to afford a viscous polyimide precursor solution. A small amount of the solution was withdrawn and diluted with N-methyl-2-pyrrolidone, followed by reprecipitation to obtain a poly(amic acid). As a result of analysis using NMR, the esterification degree of this poly(amic acid) was found to be 7.8 mole %, from which an average polymerization degree of the end-esterified poly(amic acid) is estimated at 12.8.

Next, 4.78 g of Michler's ketone, 2.39 g of 4-azidobenzalacetophenone, 7.18 g of 3-phenyl-5-isoxazolone, 1.20 g of 3,3'-carbonyl-bis(7-diethylaminocoumarin), 35.88 g of ethylene glycol dimethacrylate and 157.21 g (1 mole) of N,N-dimethylaminoethyl methacrylate were added at room temperature under a light-shielded condition. After stirring and mixing, the resultant mixture was filtered using a filter to obtain a solution of a photosensitive polyimide precursor composition.

The solution was spin-coated onto a 4-inch silicon wafer and dried under heating at 80° C. for 30 minutes to form a 30 $\mu$m thick film. The film surface was masked for patterning and exposed to light in a nitrogen atmosphere for 5 minutes, using a 7 mW/cm$^2$ ultra-high pressure mercury vapor lamp. Then, the silicon wafer thus coated was immersed in a mixed solution (7:2:1, weight ratio) of N-methyl-2-pyrrolidone, xylene and water and development was allowed to proceed until unexposed portion was dissolved and removed, followed by rinsing with isobutyl alcohol, to obtain a 28 $\mu$m thick pattern of the polyimide precursor. The pattern was then heat-treated in steps of 200° C. 30 minutes, 300° C. 30 minutes and 400° C. 30 minutes in a nitrogen atmosphere to afford a 14 $\mu$m thick polyimide pattern.

EXAMPLE 2

A solution of a photosensitive polyimide precursor composition was prepared in the same way as in Example 1 except that 58.06 g (0.5 mole) of 2-hydroxyethyl acrylate was used in place of 65.07 g (0.5 mole) of 2-hydroxyethyl methacrylate.

Using this solution, a 28 μm thick pattern of the polyimide precursor was obtained in the same manner as in Example 1. Further, heat treatment was performed in the same manner as in Example 1 to afford a 14 μm thick polyimide pattern.

EXAMPLE 3

A solution of a photosensitive polyimide precursor composition was prepared in the same way as in Example 1 except that 29.04 g (0.5 mole) of allyl alcohol was used in place of 65.07 g (0.5 mole) of 2-hydroxyethyl methacrylate.

Using this solution, a 26 μm pattern of the polyimide precursor was obtained in the same manner as in example 1. Further, heat treatment was performed in the same manner as in Example 1 to afford a 13 μm thick polyimide pattern.

EXAMPLE 4

A solution of a photosensitive polyimide precursor composition was prepared in the same way as in Example 1 except that 11.52 g (0.25 mole) of ethyl alcohol was used in place of 65.07 g (0.5 mole) of 2-hydroxyethyl methacrylate.

Using this solution, a 26 μm thick pattern of the polyimide precursor was obtained in the same manner as in Example 1. Further, heat treatment was performed in the same manner as in Example 1 to afford a 13 μm thick polyimide pattern.

EXAMPLE 5

A solution of a photosensitive polyimide precursor composition was prepared in the same way as in Example 1 except that 17.03 g (0.25 mole) of isopropyl alcohol was used in place of 65.07 g (0.5 mole) of 2-hydroxyethyl methacrylate.

Using this solution, a 26 μm thick pattern of the polyimide precursor was obtained in the same manner as in Example 1. Further, heat treatment was performed in the same manner as in Example 1 to afford a 13 μm thick polyimide film.

COMPARATIVE EXAMPLE 1

147.11 g (0.5 mole) of 3,3',4,4'-biphenyltetracartoxylic dianhydride, 75.09 g (0.375 mole) of 4,4'-diaminodiphenyl ether, 10.81 g (0.1 mole) of p-phenylenediamine, 6.21 g (0.025 mole) of bis-3-(aminopropyl)tetramethylsiloxane and 1,355.58 g of N-methyl-2-pyrrolidone were charged into a four-necked 2,000 ml flask equipped with a thermometer, a dry nitrogen inlet and a stirrer, and stirring was made at 60° C. for 3 hours while dry nitrogen was introduced, to prepare a viscous polyimide precursor solution.

Next, 4.78 g of Michler's ketone, 2.39 g of 4-azidobenzalacetophenone, 7.18 g of 3-phenyl-5-isoxazolone, 1.20 g of 3,3'-carbonyl-bis(7-diethylaminocoumarin), 35.88 g of ethylene glycol dimethacrylate and 157.21 g (1 mole) of N,N-dimethylaminoethyl methacrylate were added at room temperature under a light-shielded condition. After stirring and mixing, the resultant mixture was filtered using a filter to obtain a solution of a photosensitive polyimide precursor composition.

The solution was spin-coated onto a 4-inch silicon wafer and then dried under heating at 80° C. for 30 minutes to form a 30 μm thick film. The film surface was masked for patterning and exposed to light in a nitrogen atmosphere for 5 minutes, using a 7 mW/cm² ultra-high pressure mercury vapor lamp. The silicon wafer thus coated was then immersed in a mixed solution (7:2:1, weight ratio) of N-methyl-2-pyrrolidone, xylene and water and development was allowed to proceed until unexposed portion was dissolved and removed, followed by rinsing using isobutyl alcohol, to afford a 18 μm thick pattern of the polyimide precursor. The pattern was heat-treated in steps of 200° C. 30 minutes, 300° C. 30 minutes and 400° C. 30 minutes in a nitrogen atmosphere to obtain a 9 μm thick polyimide pattern.

EXAMPLE 6

80.56 g (0.25 mole) 3,3',4,4'-benzophenonetetracarboxylic dianhydride, 54.53 g (0.25 mole) of pyromellitic dianhydride, 13.01 g (0.1 mole) of 2-hydroxyethyl methacrylate and 300 g of N-methyl-2-pyrrolidone were charged into a four-necked 1,000 ml flask equipped with a thermometer, a dry air inlet and a stirrer, and stirring was made at 60° C. for 5 hours while dry air was introduced. Then, after cooling to room temperature, 95.11 g (0.475 mole) of 4,4'-diaminodiphenyl ether, 6.21 g (0.025 mole) of bis-3-(aminopropyl)tetramethylsiloxane and 238.61 g of N-methyl-2-pyrrolidone were added and stirring was made at 60° C. for 3 hours while dry air was introduced, to prepare a viscous polyimide precursor solution. Next, 4.72 g of Michler's ketone, 7.09 g of N-phenylglycine, 0.71 g of 3,3'-carbonyl-bis(7-diethylaminocoumarin), 23.64 g of pentaerythritol triacrylate and 78.61 g (0.5 mole) of N,N-dimethylaminoethyl methacrylate were added at room temperature under a light-shielded condition. After stirring and mixing, the resultant mixture was filtered using a filter to obtain a solution of a photosensitive polyimide precursor composition.

The solution was spin-coated onto a 4-inch silicon wafer and dried under heating at 100° C. for 10 minutes to form a 25 μm thick film. The film surface was then masked for patterning and exposed to light in a nitrogen atmosphere, using a 7 mW/cm² ultra-high pressure mercury vapor lamp. Then, the silicon wafer thus coated was immersed in a mixed solution (7:2:1, weight ratio) of N-methyl-2-pyrrolidone, xylene and water and development was allowed to proceed until unexposed portion was dissolved and removed, followed by rinsing using isobutyl alcohol, to afford a 22 μm thick pattern of the polyimide precursor. The pattern was heat-treated in steps of 150° C. minutes, 250° C. 30 minutes and 350° C. 30 minutes in a nitrogen atmosphere to obtain a 11 μm thick polyimide pattern.

EXAMPLE 7

A solution of a photosensitive polyimide precursor composition was prepared in the same way as in Example 6 except that 71.60 g (0.5 mole) of N,N-dimethylaminoethyl acrylate was used in place of 78.61 g (0.5 mole) of N,N-dimethylaminoethyl methacrylate.

Using this solution, a 22 μm thick polyimide precursor pattern was obtained from a 25 μm thick polyimide precursor film in the same manner as in Example 6. Then, heat treatment was conducted in the same manner as in Example 6 to afford a 11 μm thick polyimide pattern.

As set forth above, the compositions according to the present invention are advantageous in that when exposure and development using a developer are performed for the compositions, the dissolving speed of unexposed portion is high and the amount of exposed portion dissolved in the developer until the unexposed portion is dissolved off by the developer is small, thus ensuring the formation of a thick pattern of the polyimide precursor. According to the present invention, moreover, photosensitive polyimide precursor compositions of a high quality level can be obtained stably, efficiently and inexpensively without the formation of any harmful by-product which must be removed. Such outstanding effects are attained by the present invention.

What is claimed is:

1. A photosensitive polyimide precursor composition containing (a) a poly(amic acid) wherein at least one molecular end is an acid ester of an alcohol, (b) a compound containing carbon-carbon unsaturation having photoreactivity and (c) a photopolymerization initiator.

2. A photosensitive polyimide precursor composition as set forth in claim 1, wherein said alcohol is an unsaturated alcohol.

3. A photosensitive polyimide precursor composition as set forth in claim 1, wherein the compound containing carbon-carbon unsaturation having photoreactivity has amino group.

4. A photosensitive polyimide precursor composition as set forth in claim 1, wherein said poly(amic acid) is represented by the general formula

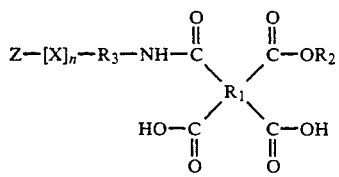

where X is represented by the general formula

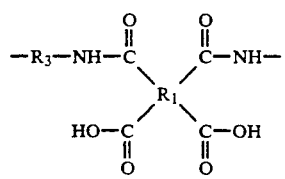

Z is represented by the general formula

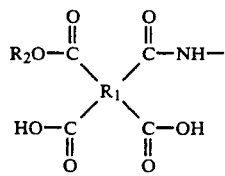

or the general formula

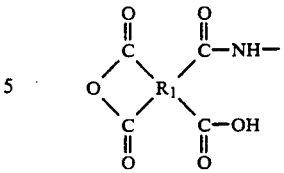

or NH$_2$; R$_1$ is a tetravalent organic group having 2 to 22 carbon atoms; R$_2$ is a monovalent organic group having 1 to 15 carbon atoms and not containing unsaturated bond, or a monovalent organic group having 3 to 15 carbon atoms and containing carbon-carbon unsaturation having photoreactivity; R$_3$ is a divalent organic group having 1 to 22 carbon atoms; and n is an integer of 0 to 99.

5. A photosensitive polyimide precursor composition as set forth in claim 2, wherein the compound containing carbon-carbon unsaturation having photoreactivity has amino group.

6. A photosensitive polyimide precursor composition as set forth in claim 5, wherein the compound containing both carbon-carbon unsaturation having photoreactivity and amino group is a compound represented by the general formula

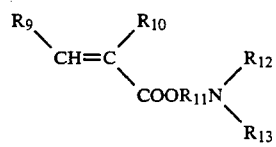

where R$_9$ is hydrogen or phenyl, R$_{10}$ is hydrogen or a lower alkyl group having 1 to 6 carbon atoms, R$_{11}$ is a substituted or unsubstituted hydrocarbon radical having 2 to 12 carbon atoms, and R$_{12}$ and R$_{13}$ are each an alkyl group having 1 to 6 carbon atoms, or by the general formula

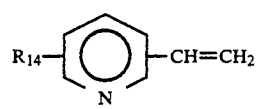

where R$_{14}$ is a substituted or unsubstituted alkyl group having 1 to 6 carbon atoms, or by the general formula

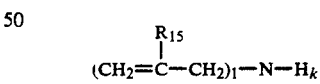

where R$_{15}$ is hydrogen or methyl, and k+l=3, k=1~3.

7. A photosensitive polyimide precursor composition as set forth in claim 5, wherein the compound containing both carbon-carbon unsaturation having photoreactivity and amino group is used in a proportion of 0.05 to 2 mole equivalents relative to the carboxyl group in the poly(amic acid) molecule.

8. A process for preparing a photosensitive polyimide precursor composition, which process comprises adding an alcohol to a tetracarboxylic dianhydride to form a tetracarboxylic monoester monoanhydride, then reacting the tetracarboxylic acid monoester monoanhydride or a mixture of the tetracarboxylic monoester monoanhydride and a tetracarboxylic dianhydride with a diamine to form a poly(amic acid) wherein at least one molecular end is an acid ester of the alcohol, and thereafter mixing a compound containing carbon-carbon unsaturation having photoreactivity and a photopolymerization initiator with the poly(amic acid).

9. A process as set forth in claim 8, wherein the addition reaction of the tetracarboxylic dianhydride and the alcohol is carried out in a proportion of 0.01 to 1 mole equivalent of the alcohol relative to the tetracarboxylic dianhydride, in an organic solvent capable of dissolving said poly(amic acid), at a temperature of 20° to 100° C., for a period of time sufficient for the formation of a product which contains the tetracarboxylic monoester monoanhydride as a main component.

10. A process as set forth in claim 9, wherein the alcohol is used in a proportion of 0.014 to 0.333 mole equivalent relative to the tetracarboxylic dianhydride.

11. A process as set forth in claim 9, wherein the diamine is used in an approximately equimolar amount relative to the whole of the tetracarboxylic acid component.

12. A process as set forth in claim 9, wherein the diamine is reacted directly with the addition reaction product of the tetracarboxylic dianhydride and the alcohol.

13. A photosensitive polyimide precursor composition as set forth in claim 1, wherein said alcohol is represented by the general formula

wherein $R_2$ is selected from the group consisting of a monovalent organic group of 1 to 15 carbon atoms not containing unsaturated bond, or a monovalent organic group of 3 to 15 carbon atoms containing unsaturated bond.

14. A photosensitive polyimide precursor composition as set forth in claim 13 wherein said alcohol is selected from the group consisting of monohydric aliphatic alcohols, polyhydric alcohols, cellosolves, 2-hydroxyethyl acrylate, 2-hydroxypropyl acrylate, glycerol acrylate, polyethylene glycol acrylate, and EO-modified phthalic acid acrylate.

15. A process for preparing a photosensitive polyimide precursor composition as set forth in claim 13 wherein said alcohol is said unsaturated alcohol.

16. A photosensitive polyimide precursor composition as set forth in claim 13, wherein the compound containing carbon-carbon unsaturation having photoreactivity has amino group.

17. A photosensitive polyimide precursor composition as set forth in claim 15, wherein the compound containing carbon-carbon unsaturation having photoreactivity has amino group.

18. A process as set forth in claim 8 wherein tetracarboxylic dianhydride is represented by the general formula

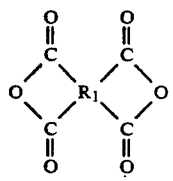

wherein $R_1$ is a tetravalent organic group having 2 to 22 carbon atoms.

19. A process as set forth in claim 18 wherein said tetracarboxylic dianhydride is selected from the group consisting of butanetetracarboxylic dianhydride, pentanetetracarboxylic dianhydride, hexanetetracarboxylic dianhydride, cyclobutanetetracarboxylic dianhydride, cyclopentanetetracarboxylic dianhydride, bicyclohexenetetracarboxylic dianhydride, cyclopropanetetracarboxylic dianhydride, methylcyclohexenetetracarboxylic dianhydride, 3,3',4,4'-benzophenonetetracarboxylic dianhydride, pyromellitic dianhydride, 3,4,9,10-perylenetetracarboxylic dianhydride, 4,4'-sulfonyldiphthalic dianhydride, 3,3',4,4'-biphenyltetracarboxylic dianhydride, 1,2,5,6-naphthalenetetracarboxylic dianhydride, 2,3,6,7-naphthalenetetracarboxylic dianhydride, 1,4,5,8-naphthalenetetracarboxylic dianhydride, and 2,3,5,6-pyridineteracarboxylic dianhydride.

20. A process as set forth in claim 8 wherein said alcohol is represented by the general formula

wherein $R_2$ is chosen from the group consisting of a monovalent organic group of 1 to 15 carbon atoms not containing unsaturated bond, or a monovalent organic group of 3 to 15 carbon atoms containing unsaturated bond.

21. A process as set forth in claim 20 wherein said alcohol is selected from the group consisting of monohydric aliphatic alcohols, polyhydric alcohols, cellosolves, 2-hydroxyethyl acrylate, 2-hydroxypropyl acrylate, glycerol acrylate, polyethylene glycol acrylate, and EO-modified phthalic acid acrylate, 2-hydroxyethyl methacrylate, 2-hydroxypropyl methacrylate, glycerol methacrylate, polyethylene glycol methacrylate and EO-modified phthalic acid methacrylate.

22. A process as set forth in claim 8 wherein said diamine is represented by the general formula

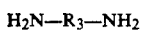

wherein $R_3$ is a divalent organic group having 1 to 22 carbon atoms.

23. A process as set forth in claim 22 wherein said diamine is selected from the group consisting of 4,4'-diaminodiphenyl ether, 4,4'-diaminodiphenylmethane, 4,4'-diaminodiphenylsulfone, 4,4'-diaminodiphenyl sulfide, m-phenylenediamine, p-phenylenediamine, 2,4-diaminotoluene, 2,5-diaminotoluene, 2,6-diaminotoluene, benzidine, 3,3'-dimethylbenzidine, 3,3'-dimethoxybenzidine, o-tolidine, 4,4'-diaminoterphenyl, 1,5-diaminonapththalene, 2,5-diaminopyridine, 3,3'-dimethyl-4,4'-diaminodiphenylmethane,4,4'-bis(p-aminophenoxy)biphenyl,2,2-bis[4-(p-aminophenoxy)phenyl]-propane and hexahydro-4,7-methanoindanylene dimethylene diamine.

24. A process for preparing a photosensitive polyimide precursor composition, which process comprises adding an alcohol represented by the general formula

wherein $R_2$ is selected from the group consisting of a monovalent organic group of 1 to 15 carbon atoms not containing unsaturated bond or a monovalent organic group of 3 to 15 carbon atoms containing unsaturated bond, to a tetracarboxylic dianhydride represented by the general formula,

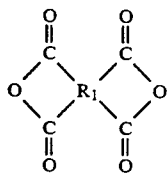

wherein $R_1$ is a tetravalent organic group having 2 to 22 carbon atoms to form a tetracarboxylic monoester monoanhydride, then reacting said tetracarboxylic monoester monoanhydride and a tetracarboxylic dianhydride is represented by the general formula

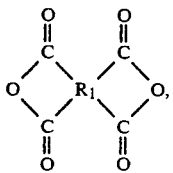

wherein $R_1$ is a tetravalent organic group having 2 to 22 carbon atoms, with a diamine represented by the general formula

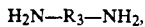

$H_2N-R_3-NH_2$, wherein $R_3$ is a divalent organic group having 1 to 22 carbon atoms to form a poly(amic acid) wherein at least one molecular end of said poly (amic acid) is an acid ester of the alcohol, and thereafter mixing a compound containing carbon-carbon unsaturation having photo-reactivity and a photo polymerization initiator with the poly(amic acid).

25. A process according to claim 24 wherein said alcohol is selected from the group consisting of monohydric aliphatic alcohols, polyhydric alcohols, cellosolves, 2-hydroxyethyl acrylate, 2-hydroxypropyl acrylate, glycerol acrylate, polyethylene glycol acrylate, and EO-modified phthalic acid acrylate, 2-hydroxyethyl methacrylate, 2-hydroxypropyl methacrylate, glycerol methacrylate, polyethylene glycol methacrylate and EO-modified phthalic acid methacrylate; said tetracarboxylic dianhydride is selected from the group consisting of butanetetracarboxylic dianhydride, pentanetetracarboxylic dianhydride, hexanetetracarboxylic dianhydride, cyclobutanetetracarboxylic dianhydride, cyclopentanetetracarboxylic dianhydride, bicyclohexenetetracarboxylic dianhydride, cyclopropanetetracarboxylic dianhydride, methylcyclohexenetetracarboxylic dianhydride, 3,3',4,4'-benzophenonetetracarboxylic dianhydride, pyromellitic dianhydride, 3,4,9,10-perylenetetracarboxylic dianhydride, 4,4'-sulfonyldiphthalic dianhydride, 3,3',4,4'-biphenyltetracarboxylic dianhydride, 1,2,5,6-naphthalenetetracarboxylic dianhydride, 2,3,6,7-naphthalenetetracarboxylic dianhydride, 1,4,5,8-naphthalenetetracarboxylic dianhydride, and 2,3,5,6-pyridineteracarboxylic dianhydride; and said diamine is selected from the group consisting of 4,4'-diaminodiphenyl ether, 4,4'-diaminodiphenylmethane, 4,4'-diaminodiphenylsulfone, 4,4-diaminodiphenyl sulfide, m-phenylenediamine, p-phenylenediamine, 2,4-diaminotoluene, 2,5-diaminotoluene, 2,6-diaminotoluene, benzidine, 3,3'-dimethylbenzidine, 3,3'-dimethyl-4,4'-diaminodiphenylmethane, 4,4'-bis(p-aminophenoxy)biphenyl, 2,2-bis[4-(p-aminophenoxy)-phenyl]propane and hexahydro-4,7-methaneoindanylene dimethylene diamine.

* * * * *